(12) United States Patent
Masataka

(10) Patent No.: US 12,527,162 B2
(45) Date of Patent: Jan. 13, 2026

(54) SEMICONDUCTOR DEVICE, METHOD OF MANUFACTURING THE SAME AND DISPLAY DEVICE

(71) Applicant: HUAWEI TECHNOLOGIES CO., LTD., Guangdong (CN)

(72) Inventor: Kano Masataka, Yokohama (JP)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 338 days.

(21) Appl. No.: 18/359,668

(22) Filed: Jul. 26, 2023

(65) Prior Publication Data

US 2023/0371313 A1 Nov. 16, 2023

Related U.S. Application Data

(63) Continuation of application No. PCT/CN2021/073926, filed on Jan. 27, 2021.

(51) Int. Cl.
*H10K 59/121* (2023.01)
*H10K 59/12* (2023.01)

(52) U.S. Cl.
CPC ..... *H10K 59/1213* (2023.02); *H10K 59/1201* (2023.02); *H10K 59/1216* (2023.02)

(58) Field of Classification Search
CPC .......... H10K 59/1213; H10K 59/1201; H10K 59/1216; G09G 2300/0469; G09G 2300/0842; G09G 3/3233
See application file for complete search history.

(56) References Cited

U.S. PATENT DOCUMENTS

| | | | |
|---|---|---|---|
| 8,134,152 B2 | 3/2012 | Choi et al. | |
| 8,324,674 B2 | 12/2012 | Yaegashi | |
| 9,129,927 B2 | 9/2015 | Gupta et al. | |
| 9,711,652 B2 | 7/2017 | Yamazaki et al. | |
| 9,818,765 B2 | 11/2017 | Osawa et al. | |
| 10,026,754 B2 | 7/2018 | Suzumura et al. | |
| 10,032,841 B2 | 7/2018 | Tsai et al. | |

(Continued)

FOREIGN PATENT DOCUMENTS

| | | |
|---|---|---|
| CN | 106024838 A | 10/2016 |
| CN | 107808895 A | 3/2018 |

(Continued)

*Primary Examiner* — Leonardo Andujar
(74) *Attorney, Agent, or Firm* — WOMBLE BOND DICKINSON (US) LLP

(57) ABSTRACT

Embodiments of the present application provide a semiconductor device and a method of manufacturing the same for implementing both polysilicon TFTs and oxide TFTs with less process complication. The semiconductor device includes first and second thin film transistor structures formed on a substrate. The first TFT structure includes a first transistor and a capacitor on the first transistor, and the second TFT structure includes a bottom metal layer, a second insulating layer on the bottom metal layer, and a second transistor on the second insulating layer. A lower electrode of the capacitor comprises the same metal material as the bottom metal layer, a dielectric layer of the capacitor comprises the same insulator material as the second insulating layer, and the upper electrode of the capacitor comprises the same oxide semiconductor material as a semiconductor active layer of the second transistor.

20 Claims, 15 Drawing Sheets

(56) References Cited

U.S. PATENT DOCUMENTS

| | | |
|---|---|---|
| 10,115,740 B2 | 10/2018 | Hanada et al. |
| 10,181,502 B2 | 1/2019 | Oh et al. |
| 10,236,330 B2 | 3/2019 | Maruyama |
| 10,249,695 B2 | 4/2019 | Ono et al. |
| 10,276,601 B2 | 4/2019 | Kanda et al. |
| 10,297,622 B2 | 5/2019 | Na et al. |
| 10,476,020 B2 | 11/2019 | Kurata et al. |
| 10,522,567 B2 | 12/2019 | Hanyu et al. |
| 10,573,666 B2 | 2/2020 | Suzumura et al. |
| 2014/0022479 A1 | 1/2014 | Hosaka et al. |
| 2015/0053935 A1 | 2/2015 | Gupta et al. |
| 2015/0055051 A1 | 2/2015 | Osawa et al. |
| 2016/0093652 A1 | 3/2016 | Ikeda et al. |
| 2016/0163745 A1 | 6/2016 | Choi et al. |
| 2016/0293643 A1 | 10/2016 | Kim et al. |
| 2016/0307988 A1 | 10/2016 | Kim et al. |
| 2017/0062539 A1 | 3/2017 | Tsai et al. |
| 2017/0062623 A1 | 3/2017 | Koezuka et al. |
| 2017/0186800 A1 | 6/2017 | Ikeda et al. |
| 2017/0221429 A1 | 8/2017 | Kobayashi et al. |
| 2018/0061920 A1 | 3/2018 | Son et al. |
| 2018/0061921 A1 | 3/2018 | Son et al. |
| 2018/0102086 A1 | 4/2018 | Katayama et al. |
| 2018/0102383 A1 | 4/2018 | Kim et al. |
| 2020/0083309 A1* | 3/2020 | Wang ................. H10D 30/6723 |
| 2020/0373369 A1 | 11/2020 | Kang et al. |
| 2020/0373569 A1* | 11/2020 | Momma ............... H01M 4/366 |

FOREIGN PATENT DOCUMENTS

| | | |
|---|---|---|
| CN | 104332485 B | 1/2019 |
| CN | 104851388 B | 1/2019 |
| CN | 109473461 A | 3/2019 |
| CN | 110890381 A | 3/2020 |
| EP | 3726771 A1 | 10/2020 |
| JP | 2016031889 A | 3/2016 |
| JP | 2019079785 A | 5/2019 |
| KR | 20100083322 A | 7/2010 |
| KR | 20100086256 A | 7/2010 |
| KR | 20110021259 A | 3/2011 |
| KR | 20110024935 A | 3/2011 |
| KR | 20170044167 A | 4/2017 |
| KR | 20170073625 A | 6/2017 |
| WO | 2003058334 A1 | 7/2003 |
| WO | 2020167077 A1 | 8/2020 |

* cited by examiner

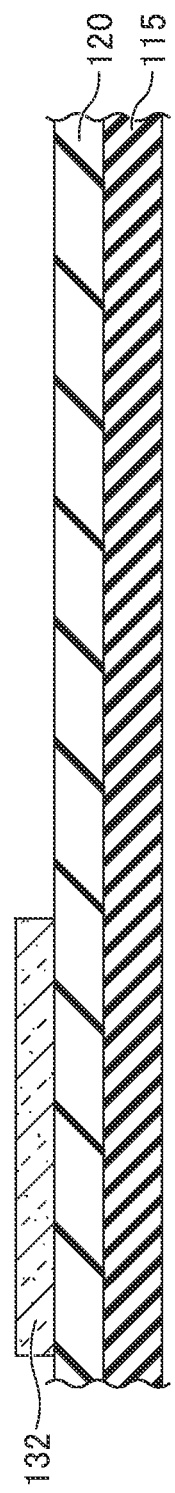

SEMICONDUCTOR DEVICE, METHOD OF MANUFACTURING THE SAME AND DISPLAY DEVICE

CROSS-REFERENCE TO RELATED APPLICATIONS

This application is a continuation of International Application No. PCT/CN2021/073926, filed on Jan. 27, 2021, the disclosure of which is hereby incorporated by reference in its entirety.

TECHNICAL FIELD

The present application relates generally to the field of semiconductor technology, and more particularly to a semiconductor device for use in a display backplane and a method of manufacturing the same.

BACKGROUND

Active matrix displays commonly incorporate a thin film transistor (TFT) backplane for controlling light emission from pixels. Such active matrix displays may include, but are not limited to, liquid crystal displays (LCDs), organic light emitting diode (OLED) displays (also referred to as organic electroluminescence (organic EL) displays), and micro light emitting diode (µLED) displays.

Recently, a TFT backplane technology that uses polysilicon TFTs and oxide TFTs in combination has been developed. The polysilicon TFTs may have some advantages, such as high carrier mobility and high stability, while the oxide TFTs may have other advantages, such as extremely low leakage current, and combining both types of TFTs allows to exploit such respective advantages. As an example, the use of polysilicon for pixel drive TFTs and the use of oxide for switching circuits may lead to a significant saving of power consumption, compared to the use of polysilicon for all TFTs.

However, such a technology involves embedding oxide TFTs into a polysilicon TFT backplane, thereby complicating the manufacturing process. When oxide TFTs are formed after formation of polysilicon TFTs, at least two additional photomasks are required for oxide patterning and gate patterning for the oxide TFTs. In addition, due to a large difference in elevation between the polysilicon layer and the oxide semiconductor layer, contacts to each of these layers are generally required to be formed in separate operations, which leads to an additional photomask. These additional manufacturing operations may lead to increased manufacturing cost and reduced manufacturing yield.

SUMMARY

An object of embodiments of the present application is to provide a semiconductor device and a method of manufacturing the same for implementing both polysilicon TFTs and oxide TFTs with less process complication. The embodiments of the present application further provide a display panel and a display device including such a semiconductor device.

According to a first aspect, a semiconductor device is provided, the semiconductor device including first and second thin film transistor (TFT) structures formed on a substrate. The first TFT structure includes a first transistor and a capacitor on the first transistor, and the second TFT structure includes a bottom metal layer, a second insulating layer on the bottom metal layer, and a second transistor on the second insulating layer. A lower electrode of the capacitor comprises the same metal material as the bottom metal layer, a dielectric layer of the capacitor comprises the same insulator material as the second insulating layer, and the upper electrode of the capacitor comprises the same oxide semiconductor material as a semiconductor active layer of the second transistor.

According to a second aspect, a method of manufacturing a semiconductor device is provided, wherein the semiconductor device includes a first thin film transistor (TFT) structure formed on a substrate and including a first transistor and a capacitor on the first transistor, and a second TFT structure formed on the substrate and including a bottom metal layer, a second insulating layer on the bottom metal layer, and a second transistor on the second insulating layer. The method includes depositing a first metal layer, which forms a lower electrode of the capacitor and the bottom metal layer, depositing a second insulator layer, which forms a dielectric layer of the capacitor and the second insulating layer, and depositing an oxide semiconductor layer, which forms an upper electrode of the capacitor and a semiconductor active layer of the second transistor. In a possible implementation of the second aspect, the method may further include using a first photomask to pattern the first metal layer into the lower electrode of the capacitor and the bottom metal layer, and using a second photomask to pattern the oxide semiconductor layer into the upper electrode of the capacitor and the semiconductor active layer of the second transistor.

According to a third aspect, a display panel is provided, the display panel including a backplane including a semiconductor device according to the first aspect or any possible implementation thereof and a front plane including a light emitting structure.

According to a fourth aspect, a display device is provided, the display device including a display panel according to the third aspect or any possible implementation thereof.

BRIEF DESCRIPTION OF DRAWINGS

FIGS. 4A-4I are a series of cross-sectional views for illustrating a method of manufacturing the semiconductor device as shown in FIG. 1.

Through these figures, the same or similar elements are indicated by the same or similar reference numerals.

DESCRIPTION OF EMBODIMENTS

To enable a person skilled in the art to better understand objectives, features, and advantages of embodiments of the present application, the following further describes the technical solutions in preferable embodiments of the present application in detail with reference to the accompanying drawings.

In the present application, the terms "first", "second", "third", and the like are intended to distinguish between similar objects, such as layers or structures, but do not necessarily indicate a particular order or sequence. It should be understood that these terms are interchangeable in proper circumstances. The terms "include", "comprise", "have" and any other variants mean to cover the non-exclusive inclusion, for example, a process, method, device, or system that includes a list of operations or elements is not necessarily limited to those operations or elements, but may include other operations or elements not expressly listed or inherent to such a process, method, device, or system. Moreover, the articles "a" and "an" as used in the present application are intended to include one or more items, and may be used interchangeably with "one or more".

Figure 1:
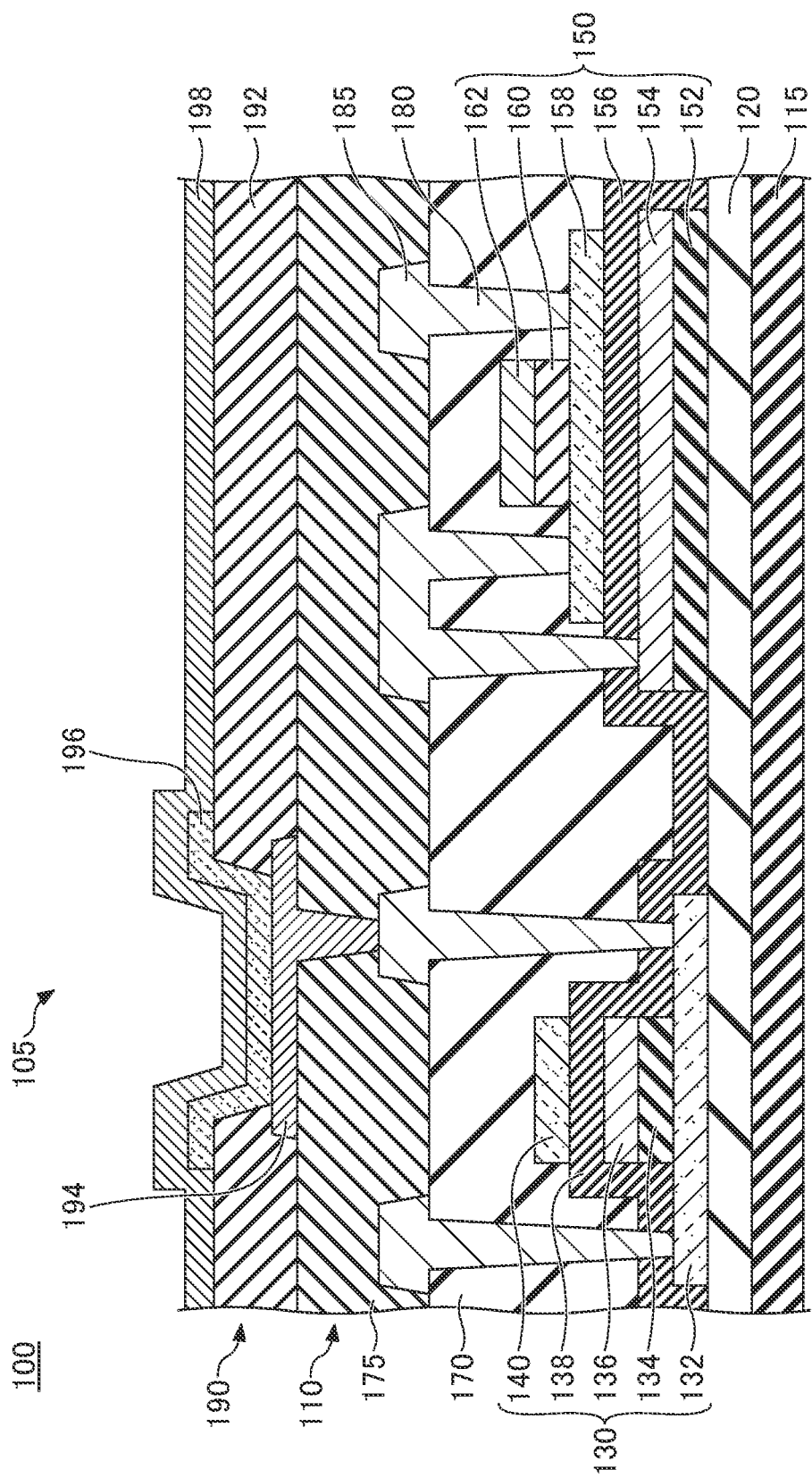
FIG. 1 is a cross-sectional view of a portion of a display panel including a semiconductor device according to a first embodiment of the present application.

FIG. 1 is a schematic cross-sectional view of a portion of a display panel 100 including a semiconductor device according to a first embodiment of the present application. The display panel 100 is a panel of active matrix type, comprising a plurality of pixels in a matrix, and a portion corresponding to a single pixel 105 is schematically shown in FIG. 1.

The display panel 100, in this example, includes a backplane comprising a semiconductor device or semiconductor structure 110 having thin film transistors (TFTs) formed on a substrate and a front plane comprising a light emitting structure 190 provided on the semiconductor structure 110.

FIG. 1 illustrates an OLED structure, as an example of the light emitting structure 190. The OLED structure 190 may be pixelated by a pixel-defining layer (PDL) 192 made of an insulator, such as a photosensitive polyimide, and may include an anode layer 194, an OLED layer 196, and a cathode layer 198. The anode layer 194 may comprise a stack of a transparent conductive oxide, such as indium tin oxide (ITO) or indium zinc oxide (IZO), and a reflective metal, such as silver (Ag). The cathode layer 198 may comprise a transparent metal layer, such as a thin magnesium (Mg) layer or a MgAg co-deposited layer. The light emitting structure 190 is not limited to the OLED structure, and may be another type of light emitting structure, such as a liquid crystal structure, a μLED structure, or the like. It should be noted that, for ease of description herein, the structure from the PLD 192 to the cathode layer 198 is referred to as the light emitting structure 190 or the front plane and the underlying structure is referred to as the semiconductor structure 110 or the backplane.
However, embodiments of the present application are not limited thereto. For example, the anode layer 194 and the pixel-defining layer 192 may be considered as parts of the semiconductor structure 110.

The semiconductor structure 110 may include a substrate 115, a buffer layer 120 on the substrate 115, and a first TFT structure 130 and a second TFT structure 150 formed thereon. The semiconductor structure 110 may also include an interlayer dielectric (ILD) layer 170 covering the TFT structures 130, 150, and a planarizing layer 175 formed on the ILD layer 170 to provide a planar surface to the light emitting structure 190. Additionally, the semiconductor structure 110 may include a plurality of contacts 180 that pass through at least the ILD layer 170 and contact to different portions of the TFT structure 130, 150, and a plurality of traces 185 formed on the ILD layer 175 and connected to the contacts 180. It can be understood that in the cross-sectional view of FIG. 1, only some of the contacts 180 and traces 185 may be visible.

The substrate 115 may be, for example, a glass substrate. As another example, the substrate 115 may be a layered substrate comprising a glass substrate with a film of resin (e.g., polyimide) applied thereon. In such an example, the glass substrate may be eventually removed from such a layered substrate, and the remaining resin film may constitute the substrate 115. The buffer layer 120 may comprise silicon oxide (SiOx) or silicon oxynitride (SiON) and may perform functions known to those skilled in the art, such as provision of a barrier against diffusion of impurities from the substrate 115 and/or provision of a smoother surface.

Each of the first TFT structures 130 and the second TFT structures 150 may comprise a stack formed on the buffer layer 120. In the illustrated example, the first TFT structure 130 includes a first transistor having an active layer of polysilicon and a capacitor integrated on the first transistor. The second TFT structure 150 includes a second transistor having an active layer of an oxide semiconductor.

More particularly, the first transistor, which the first TFT structure 130 includes, may comprise a polysilicon active layer 132, as well as a gate insulating layer 134 and a gate electrode 136 sequentially stacked on the active layer 132. The gate insulating layer 134 and the gate electrode 136 may have sidewalls aligned with each other. The portions of the polysilicon active layer 132 that are not covered by the gate electrode 136 (and the gate insulating layer 134) may be implanted with impurities to act as source/drain (S/D) regions of the first transistor, and the covered portion may act as a channel region.

The capacitor, which the first TFT structure 130 includes, may include the gate electrode 136 of the first transistor as a lower electrode. The capacitor may further include a dielectric layer 138 over the first transistor, and a patterned upper electrode 140 on the dielectric layer 138.

The second TFT structure 150 may include a first insulating layer 152, a bottom metal layer (BML) 154, and a second insulating layer 156, which are sequentially stacked on the buffer layer 120, and the second transistor integrated on these layers 152-156. The first insulating layer 152 and the bottom metal layer 154 may have sidewalls aligned with each other, and the sidewalls may be surrounded with the second insulating layer 156. The second transistor may include a patterned oxide active layer 158 on the second insulating layer 156. The second transistor may further include a gate insulating layer 160 and a gate electrode 162 sequentially stacked on the oxide active layer 158, and the gate insulating layer 160 and the gate electrode 162 may have sidewalls aligned with each other. The oxide active layer 158 may comprise, but is not limited to, In—Ga—Zn—O, In—Sn—Ga—Zn—O, or In—Sn—Zn—O. Each of those portions of the oxide active layer 158 that are not covered by the gate electrode 162 (and the gate insulating layer 160) is at least partially converted to a conductor and may act as a source/drain (S/D) region of the second transistor. The covered portion of the oxide active layer 158 may act as a channel region.

As an example, the bottom metal layer 154 of the second TFT structure 150 may be electrically connected, via one of the contacts 180, to the source region of the oxide active layer 158 as shown in FIG. 1, to stabilize the electrical potential of the channel region of the second transistor and thus the electrical characteristics of the second transistor. Alternatively, the bottom metal layer 154 may be connected to the gate electrode 162 to perform a similar function. The bottom metal layer 154 may also perform other functions, such as shielding a light from the back side of the substrate 115.

According to embodiments of the present application, the first insulating layer 152 and the bottom metal layer 154 of the second TFT structure 150 can be formed from the same materials as the gate insulating layer 134 and the gate electrode/capacitor lower electrode 136 of the first TFT structure 130, respectively. In addition, the second insulating layer 156 and the oxide active layer 158 of the second TFT structure 150 can be formed from the same materials as the capacitor dielectric layer 138 and the capacitor upper electrode 140 of the first TFT structure 130, respectively.

The first insulating layer 152 of the second TFT structure 150 and the gate insulating layer 134 of the first TFT structure 130 may be formed of, but not limited to, silicon oxide (SiOx). The bottom metal layer 154 of the second TFT structure 150 and the gate electrode/capacitor lower electrode 136 of the first TFT structure 130 may be formed of, but not limited to, molybdenum (Mo).

The second insulating layer 156 of the second TFT structure 150 and the capacitor dielectric layer 138 of the first TFT structure 130 may be formed of, for example, silicon oxide (SiOx), silicon nitride (SiNx), or a combination thereof (SiNx/SiOx). However, this layer is preferably formed of SiOx or a stack of SiNx and overlying SiOx, rather than SiNx (having been commonly used in the prior art in order to achieve a desired capacitance). When SiNx, which generally contains hydrogen, is used, the hydrogen may diffuse through the ILD layer 170 and thereby adversely affect the threshold voltage Vth of the oxide transistor (i.e., the second transistor). The use of the SiOx layer or the stack of SiNx/SiOx layers as described above may help realization of more stable oxide TFTs.

The oxide active layer 158 of the second TFT structure 150 may be formed of, for example, In—Ga—Zn—O, In—Sn—Ga—Zn—O, or In—Sn—Zn—O, as described above. According to embodiments of the present application, the capacitor upper electrode 140 of the first TFT structure 130 can also be formed from the same oxide semiconductor. Additionally, the portions (S/D regions) of the oxide active layer 158 that are not covered by the gate electrode 162 each can be at least partially converted to a conductor as described above, and also the capacitor upper electrode 140 can be at least partially converted to a conductor in the same way.

Thus, the first TFT structure 130 and the second TFT structure 150 are formed from the same materials as one another with regard to four layers of the respective stacks, which means that fabrication operations for forming these respective layers can be shared, as described in more detail below with reference to FIGS. 4A-4I. In addition, the gate electrode 136 and the gate insulating layer 134 of the first TFT structure 130 and the bottom metal layer 154 and the first insulating layer 152 of the second TFT structure 150 can be simultaneously patterned using a single photomask. Similarly, the capacitor upper electrode 140 and the oxide active layer 158 can be simultaneously patterned using another single photomask. Accordingly, the semiconductor device and thus the display panel in accordance with embodiments of the present application can be manufactured with less process complication by sharing photomasks and fabrication operations, while having both of polysilicon TFTs and oxide TFTs.

Furthermore, the sharing of fabrication operations described above can reduce the difference in elevation between the top surfaces of the polysilicon active layer 132 of the first TFT structure 130 and the oxide active layer 158 of the second TFT structure 150, thereby facilitating the simultaneous formation of the S/D contacts 180 onto these two layers 132 and 158. This may reduce damage to the oxide active layer 158 located in a higher elevation due to dry etching for contact formation, thereby resulting in more stable device properties of the oxide transistor. This will be described in more detail with reference to FIG. 2 along with FIG. 1.

Figure 2:
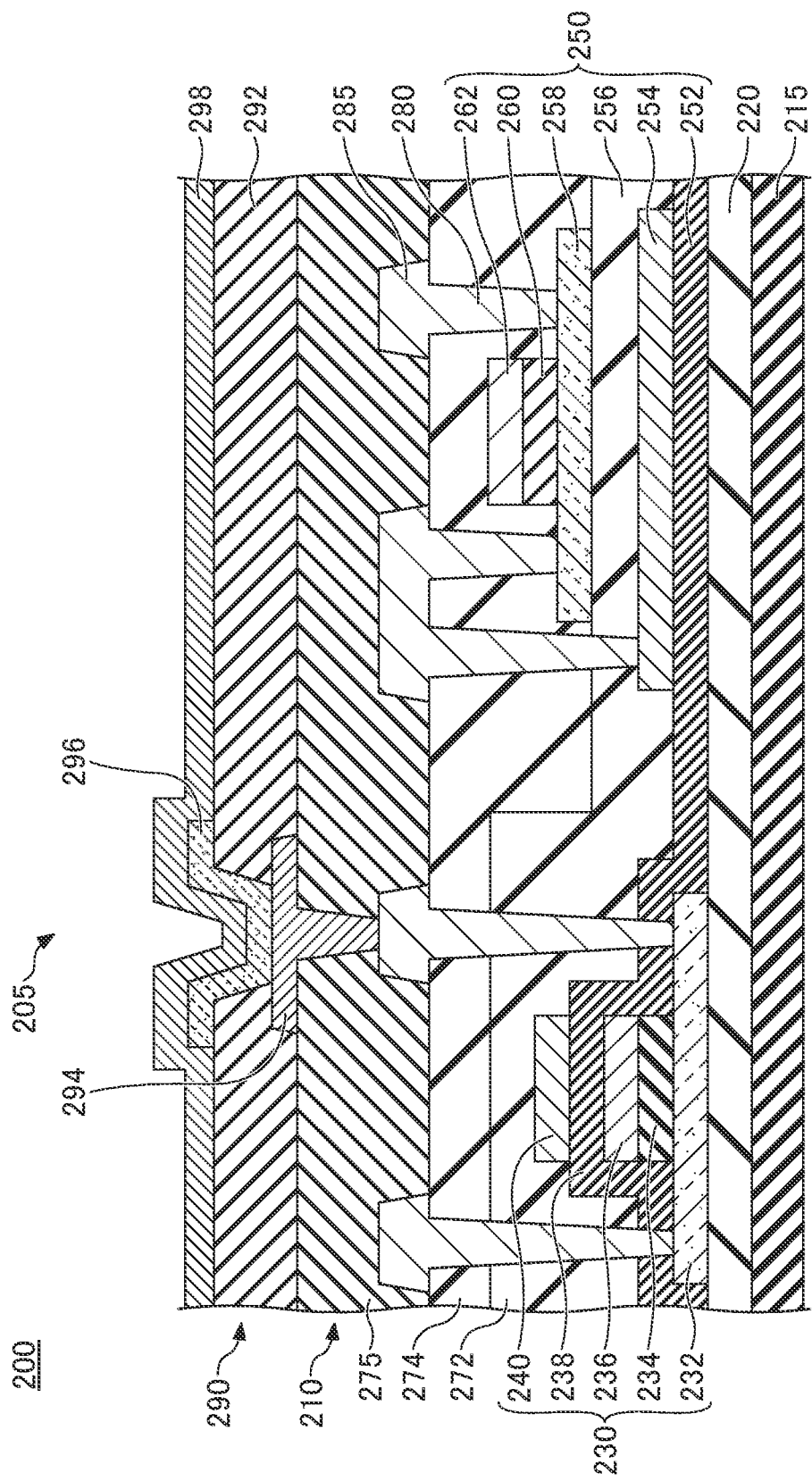
FIG. 2 is a cross-sectional view of a portion of a display panel including a semiconductor device according to a comparative example.

FIG. 2 illustrates a portion of a display panel 200 including a semiconductor device or semiconductor structure 210 as a comparative example, wherein a capacitor upper electrode 240 in a first TFT structure 230 and a bottom metal layer 254 in a second TFT structure 250 are intended to be formed in the same operation. The display panel 200 has similar layers and elements to those in the display panel 100 shown in FIG. 1, and descriptions for each of such layers and elements will not be repeated herein. With the semiconductor structure 210, the ILD layer covering the first TFT structure 230 would generally consist of a lower sub-ILD layer 272 and an upper sub-ILD layer 274 such that the lower sub-ILD layer 272 extends beneath the oxide active layer 258. However, such a lower sub-ILD layer 272 would generally require as much as 200 nm in thickness, and thus would increase the difference in elevation between the top surfaces of the polysilicon active layer 232 and the oxide active layer 258. On the other hand, with the semiconductor structure 110 in FIG. 1, any of the layers 152-156 located below the oxide semiconductor layer 158 can be formed much thinner than the lower sub-ILD layer 272, thereby realizing the aforementioned effects.

It should be noted that even when there is a large difference in elevation as in FIG. 2, if the S/D contacts 280 are separately formed with respect to the polysilicon active layer 232 and the oxide active layer 258, the problem of etch damage to the layer 258 can be solved. However, it will require one more additional photomask and further increase the manufacturing cost. It can also be understood that the comparative example in FIG. 2 would require an additional photomask relative to FIG. 1 in order to pattern the oxide active layer 258 (independently from any layer in the first TFT structure 230).

Figure 3:
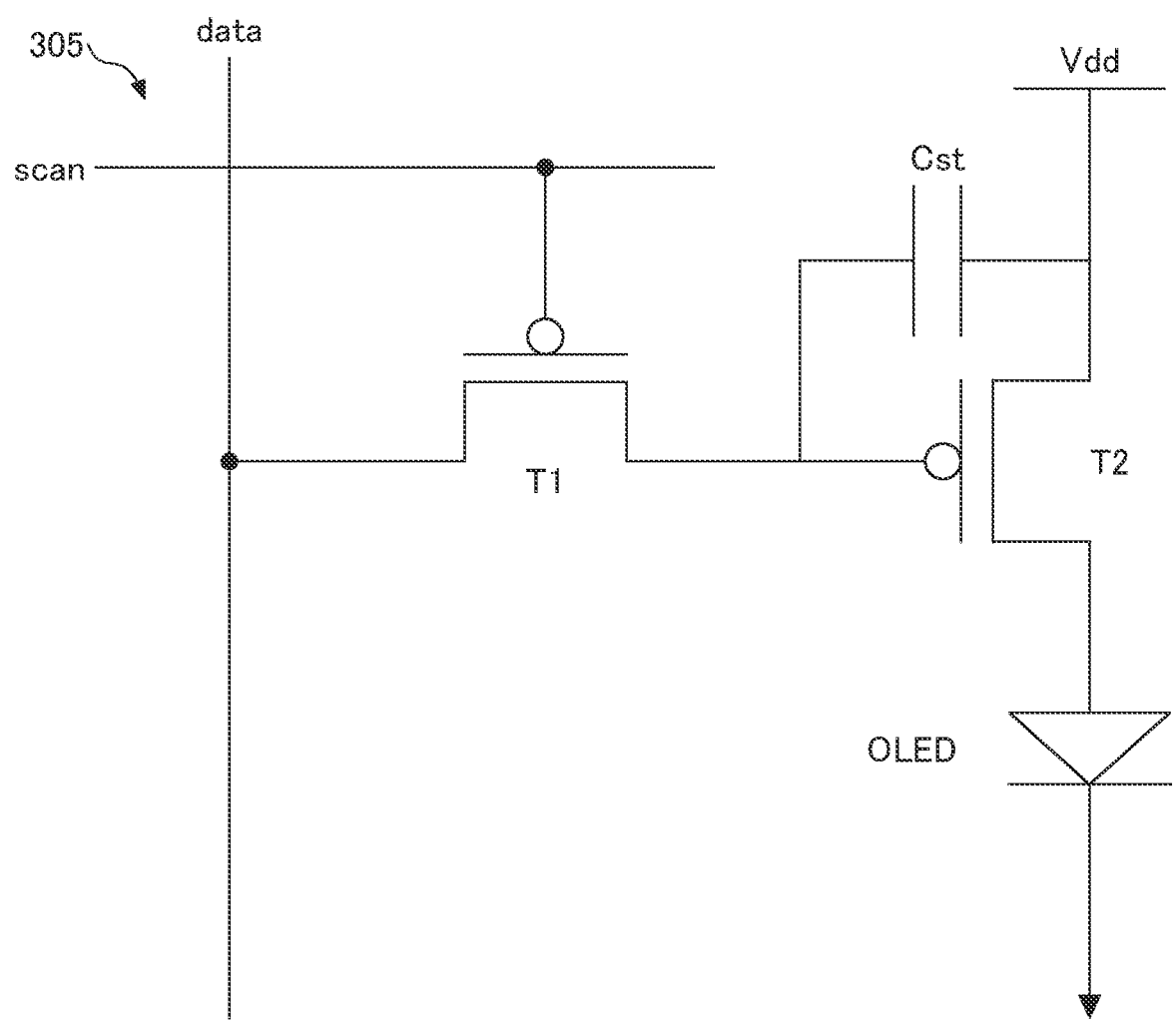
FIG. 3 is a circuit diagram illustrating an example of a pixel.

Referring now to FIG. 3, there is shown a schematic circuit diagram of an example of a pixel 305, which may correspond to the pixel 105 of the display panel 100 in FIG. 1. The example in FIG. 3 illustrates, as a simple pixel circuit, a 2T1C circuit that controls OLED emission using two transistors, namely, switching transistor T1 and driving transistor T2, and one storage capacitor $C_{st}$.

The switching transistor T1 may be configured to pass a data signal supplied on a data line to the gate electrode of the driving transistor T2 in response to a scan signal supplied on a scan line. The driving transistor T2 may be configured to provide an OLED with a current based on the data signal. The storage capacitor $C_{st}$ may be configured to store the voltage of the data signal passed to the driving transistor T2 until the next refresh.

In the illustrated example, the driving transistor T2, the switching transistor T1, and the storage capacitor $C_{st}$ in FIG. 3 may correspond to the first transistor, the second transistor, and the capacitor as described in connection with FIG. 1, respectively. This may enable the advantages of polysilicon TFTs, such as high carrier mobility and high stability, to be utilized for the driving transistor T2, while utilizing the advantages of oxide TFTs, such as extremely low leakage current, for the switching transistor T1. Consequently, this may also reduce the power consumption of the semiconductor device, as compared to the use of polysilicon TFTs for both transistors T1 and T2.

It can be understood, however, that the configuration of the semiconductor device in FIG. 1 and the circuit diagram in FIG. 3 are merely examples, and the semiconductor device may include any suitable number of TFTs in any suitable configuration. For example, each pixel circuit may include three or more TFTs and may constitute a more complex circuit, such as a 6T1C circuit. In addition, embodiments of the present application are not limited to polysilicon transistors and oxide transistors being driving transistors and switching transistors, respectively. Moreover, embodiments of the present application are not necessarily limited to cases in which pixel circuits include both polysilicon transistors and oxide transistors. For example, polysilicon transistors and oxide transistors may be used as appropriate in the entire backplane, including any peripheral circuitry connected to the matrix of pixels. In other words, embodiments of the present application are equally applicable to a backplane including at least one polysilicon TFT and at least one oxide TFT. The configuration of the semiconductor device may be determined depending on a desired application and/or capability, for example, variable frequency drive (or variable refresh rate drive), high frequency or low frequency drive, and/or low power consumption.

In other words, in an embodiment, a semiconductor device and/or a display panel can be manufactured using a smaller number of photomasks and a less complicated process, while having a combination of polysilicon transistor and oxide transistor depending on a desired application and/or capability. This can result in higher production yield, higher production throughput, higher consumption efficiency in material/energy, and hence, lower production cost.

Referring now to FIGS. 4A-4I, a method of manufacturing a semiconductor device according to an embodiment of the present application will be described. FIGS. 4A-4I are a series of schematic cross-sectional views illustrating a method of manufacturing the semiconductor device 110 (also referred to as the semiconductor structure 110) and the display panel 100 shown in FIG. 1.

Referring to FIG. 4A, a structure obtained by using a first photomask is illustrated. The buffer layer 120 may be first deposited on the substrate 115. The substrate 115 may be, for example, a glass substrate or a layered substrate comprising a glass substrate with a polyimide film applied thereon. The buffer layer 120 may generally comprise SiOx and/or SiON deposited by plasma enhanced CVD (PECVD).

A polycrystalline silicon layer may then be formed and patterned into the polysilicon active layer 132 using the first photomask. The formation of the polycrystalline silicon layer may be performed by a low temperature process below 450° C., and may involve deposition of an amorphous silicon layer by PECVD and crystallization using an excimer laser. The polycrystalline silicon layer may have a thickness of, for example, about 50 nm and may be patterned by a conventional photolithography and dry etching process.

Figure 4B:
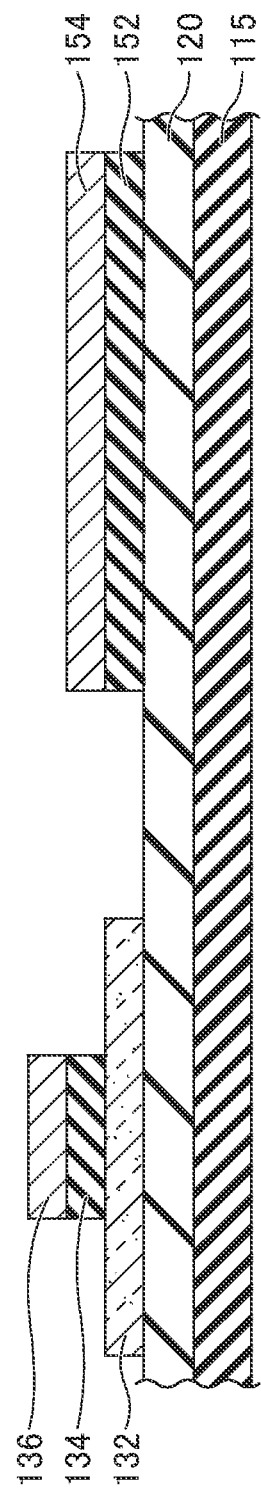

Referring now to FIG. 4B, a second photomask may be used to form the gate insulating layer 134 and the gate electrode/capacitor lower electrode 136 of the first TFT structure and the first insulating layer 152 and the bottom metal layer 154 of the second TFT structure. A first insulator layer and a first metal layer may be deposited over the structure in FIG. 4A, and both these layers can be patterned using the second photomask. The first insulator layer may form the gate insulating layer 134 of the first TFT structure and the first insulating layer 152 of the second TFT structure, while the first metal layer may form the gate electrode/capacitor lower electrode 136 of the first TFT structure and the bottom metal layer 154 of the second TFT structure.

The first insulator layer may generally comprise PECVD SiOx. The first metal layer may comprise Mo deposited by sputtering. The first metal layer may comprise another metal, such as an aluminum (Al) alloy or tungsten (W). The first insulator layer and the first metal layer may each be deposited, for example, to a thickness of about 100 nm or less. The first metal layer and the first insulator layer can be sequentially patterned using the same second photomask by, for example, a conventional photolithography and dry etching process. A doping may be then performed to the S/D regions of the polysilicon active layer 132 of the first TFT structure.

Figure 4C:
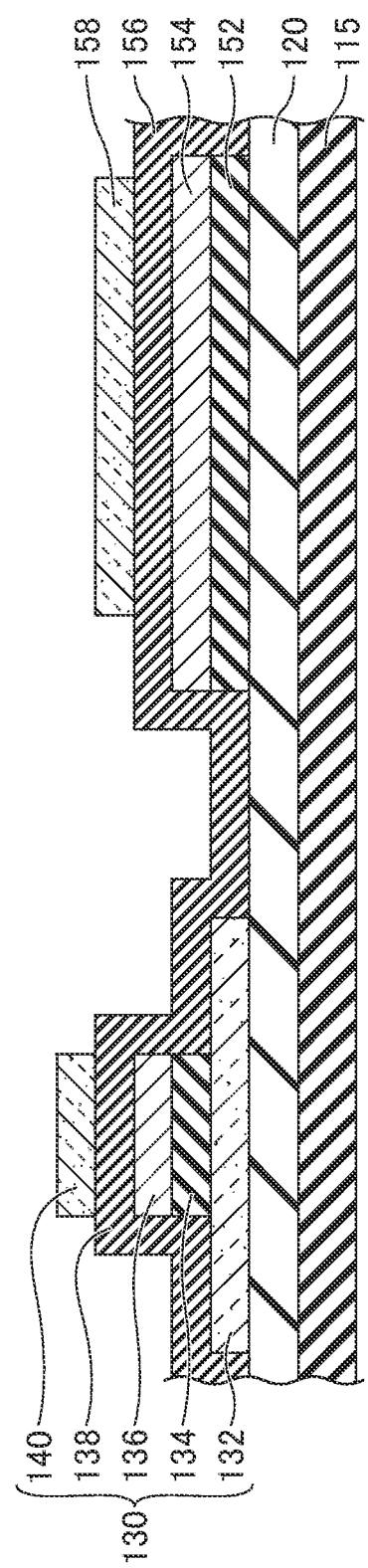

Referring now to FIG. 4C, a structure obtained by using a third photomask is illustrated. A second insulator layer and an oxide semiconductor layer may be deposited over the structure in FIG. 4B and the oxide semiconductor layer may be patterned using the third photomask to the capacitor upper electrode 140 of the first TFT structure 130 and the oxide active layer 158 of the second TFT structure. The second insulator layer may not be patterned. In other words, the second insulator layer may form a continuous layer including the capacitor dielectric layer 138 of the first TFT structure 130 and the second insulating layer 156 of the second TFT structure.

The second insulator layer may preferably comprise PECVD SiOx. As described above in connection with FIG. 1. By using SiOx rather than SiNx, the problem of diffusion of hydrogen adversely affecting the threshold voltage Vth of the oxide transistor can be avoided. This may help realize more stable oxide TFTs. The second insulator layer may, in some embodiments, comprise an SiNx layer and an SiOx layer covering the SiNx layer.

The oxide semiconductor layer may comprise, for example, In—Ga—Zn—O, In—Sn—Ga—Zn—O, or In—Sn—Zn—O and may be deposited, for example, to a thickness of about 50 nm by sputtering. The oxide semiconductor layer can typically be patterned by a wet etching process.

Figure 4D:
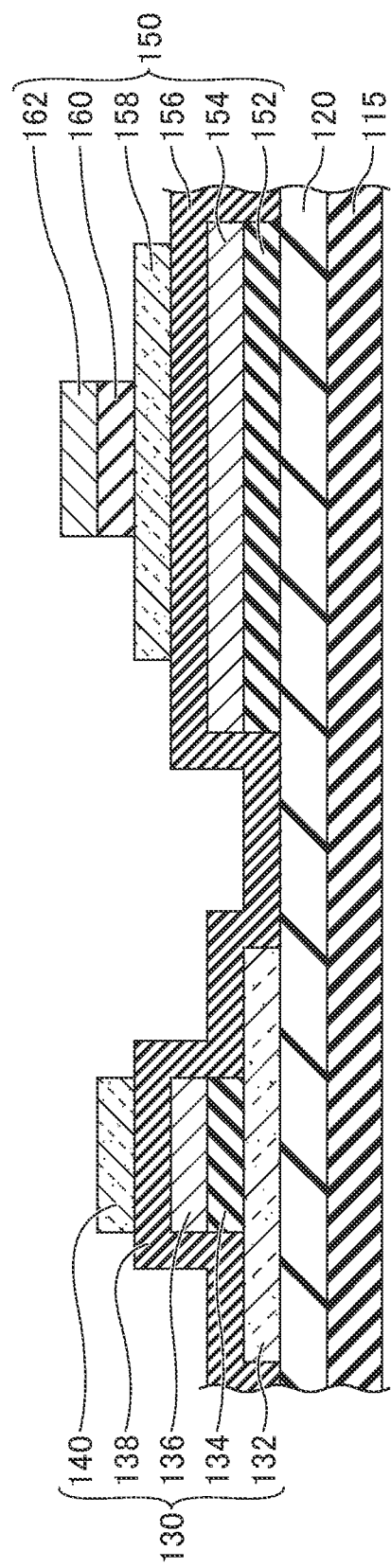

Referring now to FIG. 4D, a fourth photomask may be used to form the gate insulating layer 160 and the gate electrode 162 of the second TFT structure 150 over the oxide active layer 158. This may be carried out, but not limited to, in a similar manner to the process described in connection with FIG. 4B. More particularly, this may include sequentially depositing a third insulator layer and a second metal layer over the structure in FIG. 4C. The third insulator layer may comprise PECVD SiOx. The second metal layer may comprise Mo deposited by sputtering. The second metal layer may comprise another metal, such as an Al alloy or W. The third insulator layer and the second metal layer may each be deposited, for example, to a thickness of about 100 nm or less. The second metal layer and the third insulator layer can be sequentially patterned using the same fourth photomask by, for example, a conventional photolithography and dry etching process.

It should be noted that plasma used during this dry etching can at least partially convert exposed portions of the oxide semiconductor to a conductor. Thus, the capacitor upper electrode 140 of the first TFT structure 130 and those portions of the oxide active layer 158 of the second TFT structure 150 that are not covered by the gate electrode 162 (i.e., the S/D regions) can become the conductor automatically.

Figure 4E:
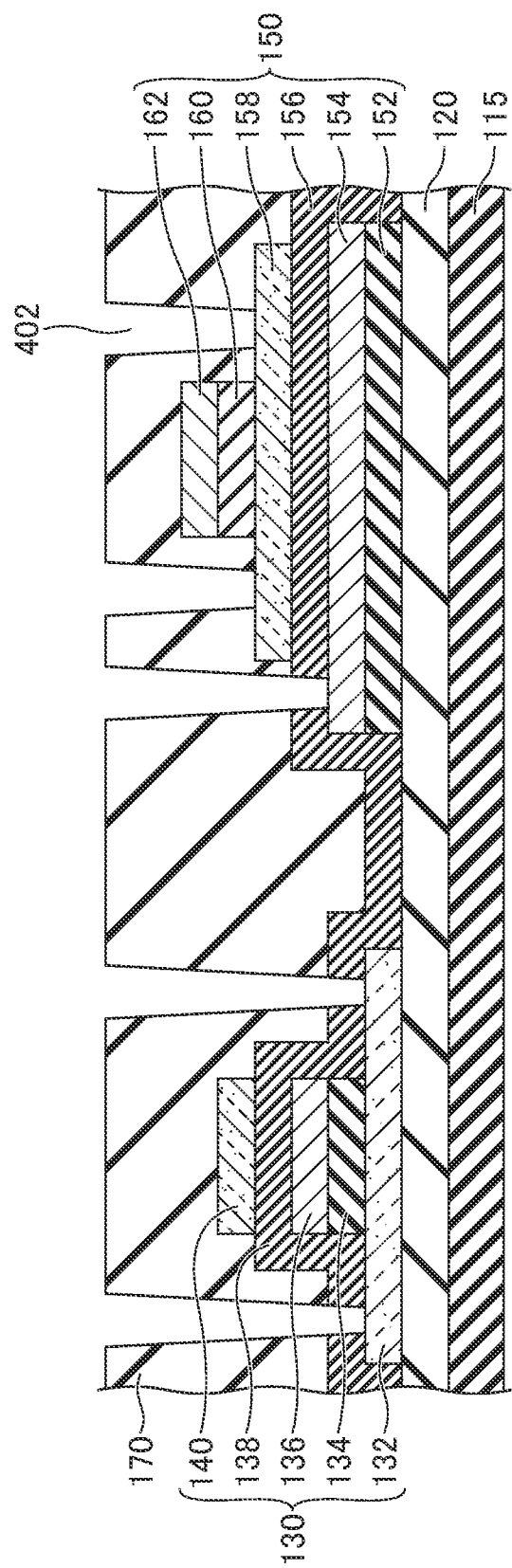

Referring now to FIG. 4E, a structure obtained by using a fifth photomask is illustrated. The ILD layer 170 may be deposited over the structure in FIG. 4D and then the fifth photomask may be used to form a plurality of contact holes 402 so as to expose parts of the S/D regions of the polysilicon active layer 132, the S/D regions of the oxide active layer 158, and the bottom metal layer 154. It should be noted that in cross-sections not shown, contact holes may also be formed simultaneously to other electrodes in the backplane, for example, the gate electrode/capacitor lower electrode 136 and the capacitor upper electrode 140 of the first TFT structure, as well as, the gate electrode 162 of the second TFT structure.

The ILD layer 170 may generally comprise PECVD SiOx, SiNx, SiON, or any combination thereof. The thickness of the ILD layer 170 may be, for example, about 500 nm. The ILD layer 170 may have a non-planar top surface that partially conforms to the underlying structure, unlike the illustrated layer. It should be noted that plasma used during this deposition and/or hydrogen contained in the ILD layer material can also contribute to converting the exposed portions of the oxide semiconductor (i.e., the capacitor upper electrode 140 and the S/D regions of the oxide active layer 158) to the conductor.

The contact holes 402 may be formed through the ILD layer 170 or through the ILD layer 170 and the second insulating layer 138, 156 by a conventional photolithography and dry etching process. It should be noted that, as discussed above with reference to FIGS. 1 and 2, the relatively small difference in elevation between the top surfaces of the polysilicon active layer 132 of the first TFT structure and the oxide active layer 158 of the second TFT structure can facilitate the simultaneous formation of the contact holes 402. That is, this relatively small difference in elevation may reduce damage to the oxide active layer 158 located in a higher elevation due to dry etching for contact formation, thereby resulting in more stable device properties of the oxide transistor.

Figure 4F:
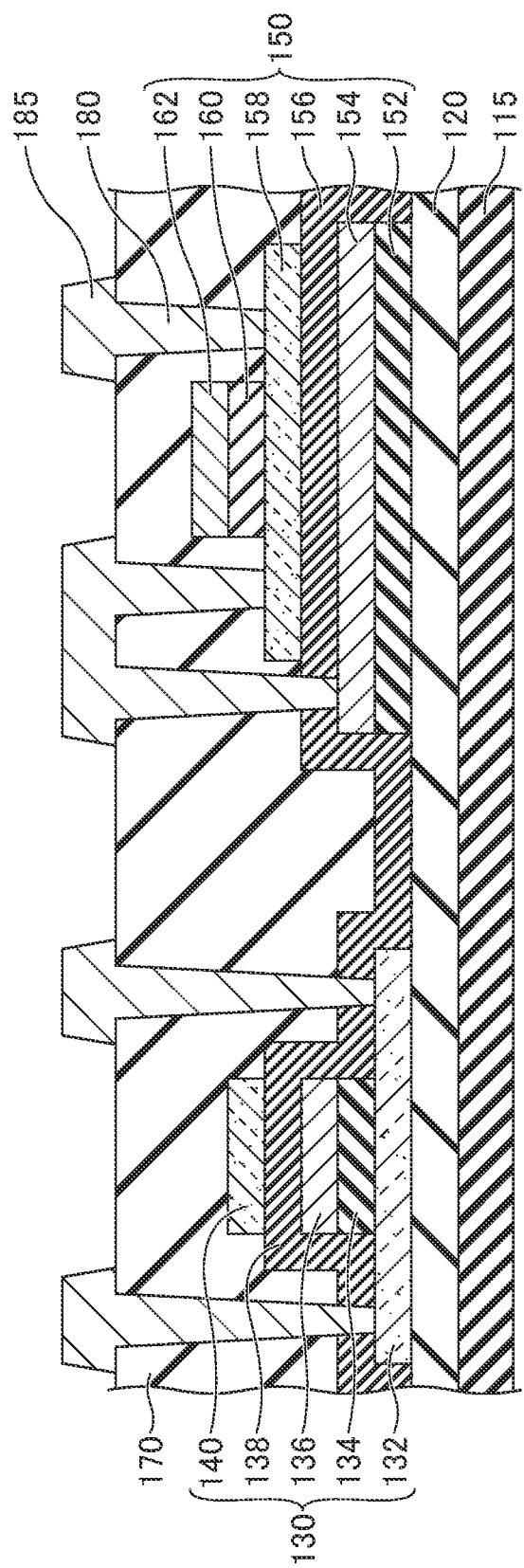

Referring now to FIG. 4F, the contact 180 within the contact holes 402 and traces 185 (including S/D electrodes of the first and second transistors) on the ILD layer can be formed. This may include depositing a contact electrode layer into the contact holes 402 and onto the ILD layer 170 and using a sixth photomask to pattern the contact electrode layer deposited on the top surface of the ILD layer 170. For example, the contact electrode layer may comprise a Ti/Al/Ti layer and may be deposited by sequential sputtering and patterned by a conventional photolithography and etching process.

Figure 4G:
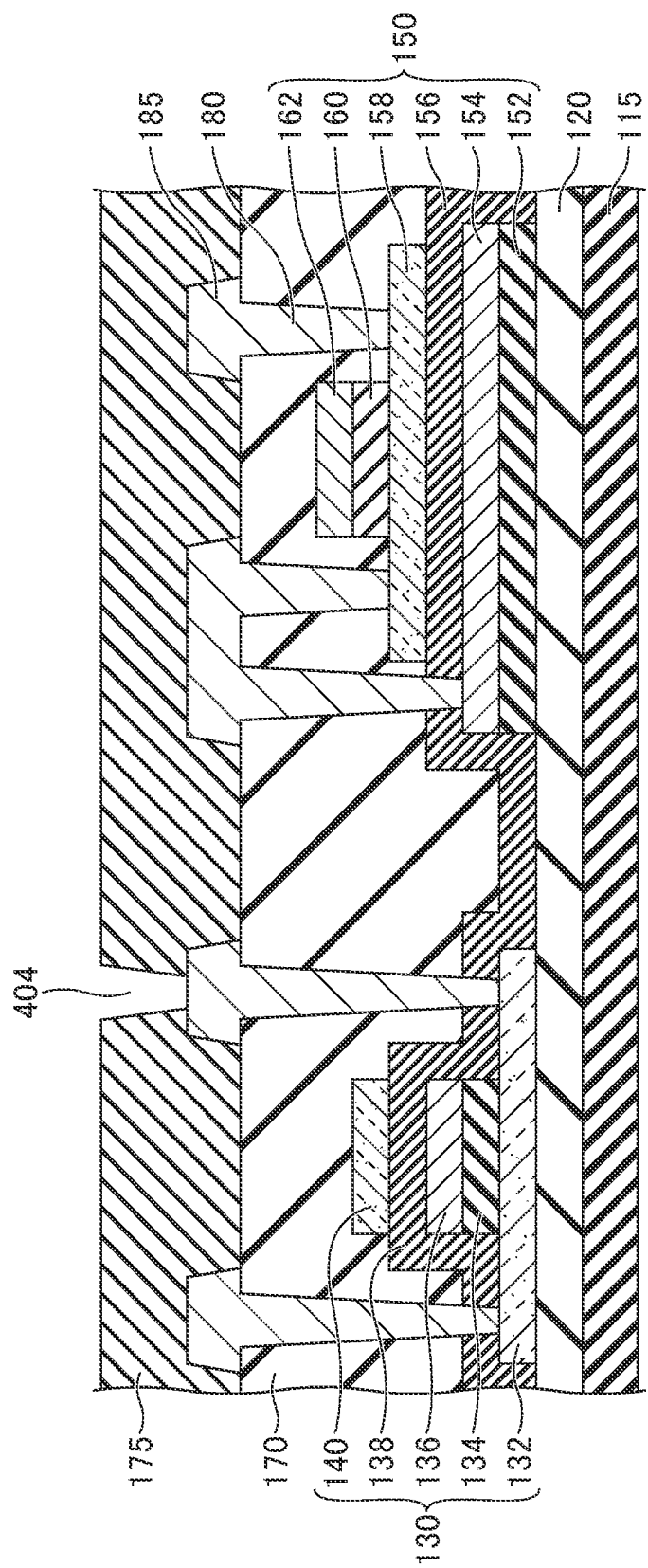

Referring now to FIG. 4G, a structure obtained by using a seventh photomask is illustrated. The planarization layer 175 may be deposited over the structure in FIG. 4F and the seventh photomask is used to form a via hole 404 so as to expose one of the S/D electrodes 185 of the first transistor. The planarization layer 175 may be deposited, for example, by coating a photosensitive polyimide layer to provide a planar surface for forming a light emitting structure (for example, the OLED structure 190 in FIG. 1) or a front plane.

Figure 4H:
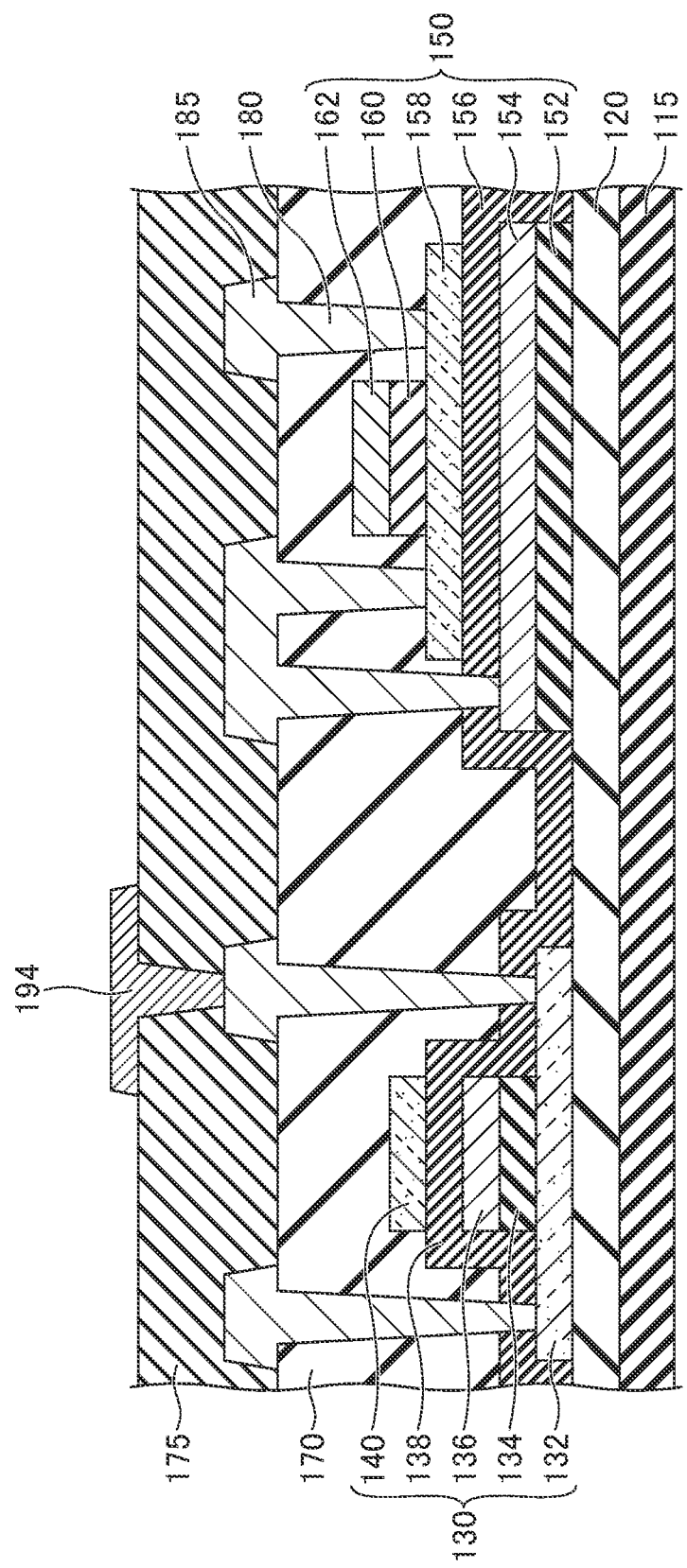

Referring now to FIG. 4H, a structure obtained by using an eighth photomask is illustrated. A pixel electrode layer may be deposited over the structure in FIG. 4G and patterned into a pixel electrode 194 using the eighth photomask. In this example, the pixel electrode 194 can be the OLED anode electrode 194. In an example, the pixel electrode layer may comprise an ITO/Ag/ITO layer and may be deposited by sequential sputtering and patterned by a conventional photolithography and etching process.

Figure 4I:
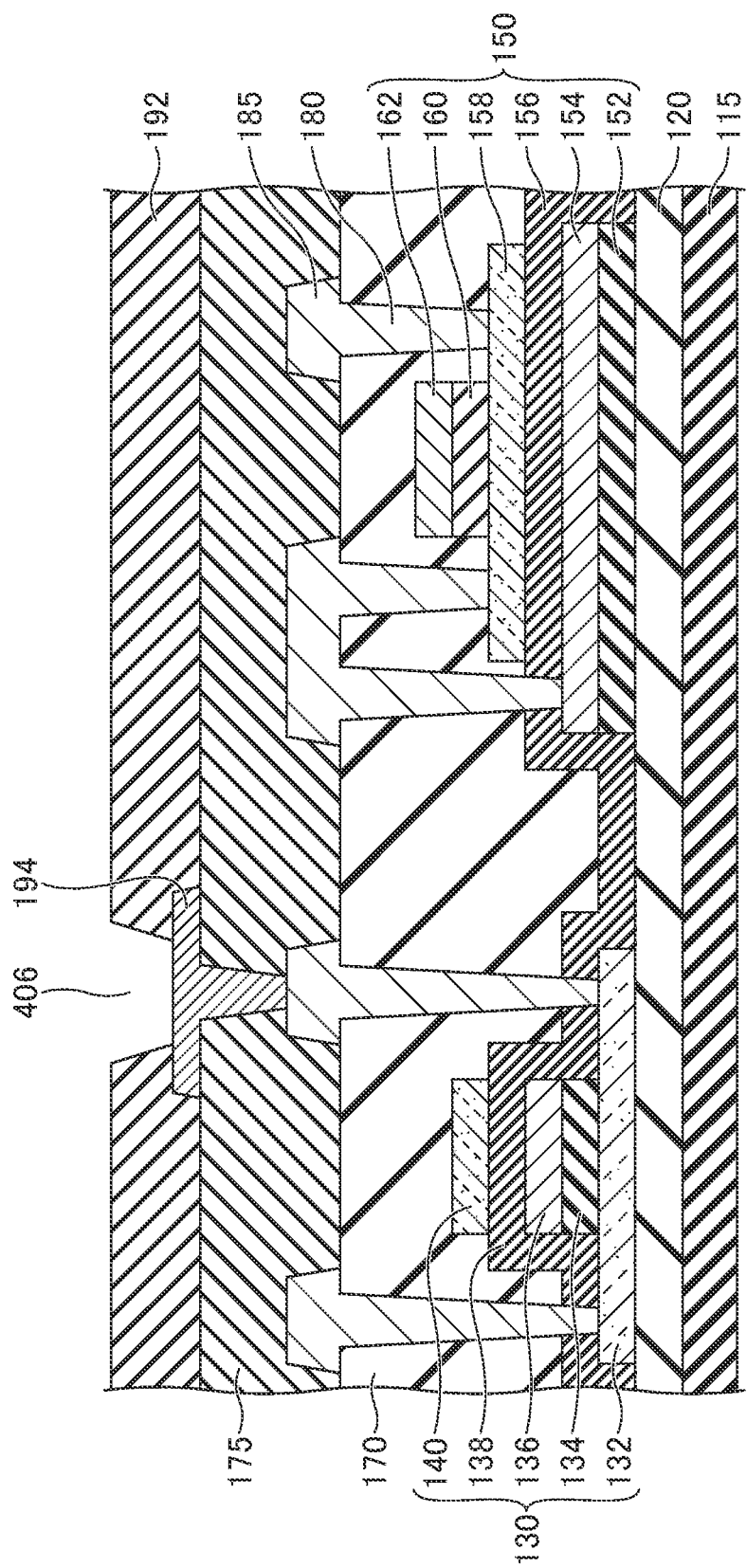

Referring now to FIG. 4I, a ninth photomask may be used to form the pixel-defining layer (PDL) 192 having an opening 406 that exposes the pixel electrode 194. This may include, for example, coating a photosensitive polyimide layer over the structure in FIG. 4H and using the ninth photomask to pattern the photosensitive polyimide layer by a conventional photolithography and etching process.

Thereafter, the light emitting structure 190 and thus the display panel 100 as shown in FIG. 1 can be completed by forming, in this example, the OLED layer 196 and the cathode layer 198. As described above, the light emitting structure 190 is not limited to the OLED structure, but may be another type of light emitting structure, such as a liquid crystal structure, a μLED structure, or the like. It can be understood that depending on a particular display panel, the process described above may be modified as appropriate. For example, in the case of a transmissive liquid crystal display panel, the pixel electrode may have a transparent electrode such as an ITO layer, instead of the ITO/Ag/ITO layer described above.

Figure 5:
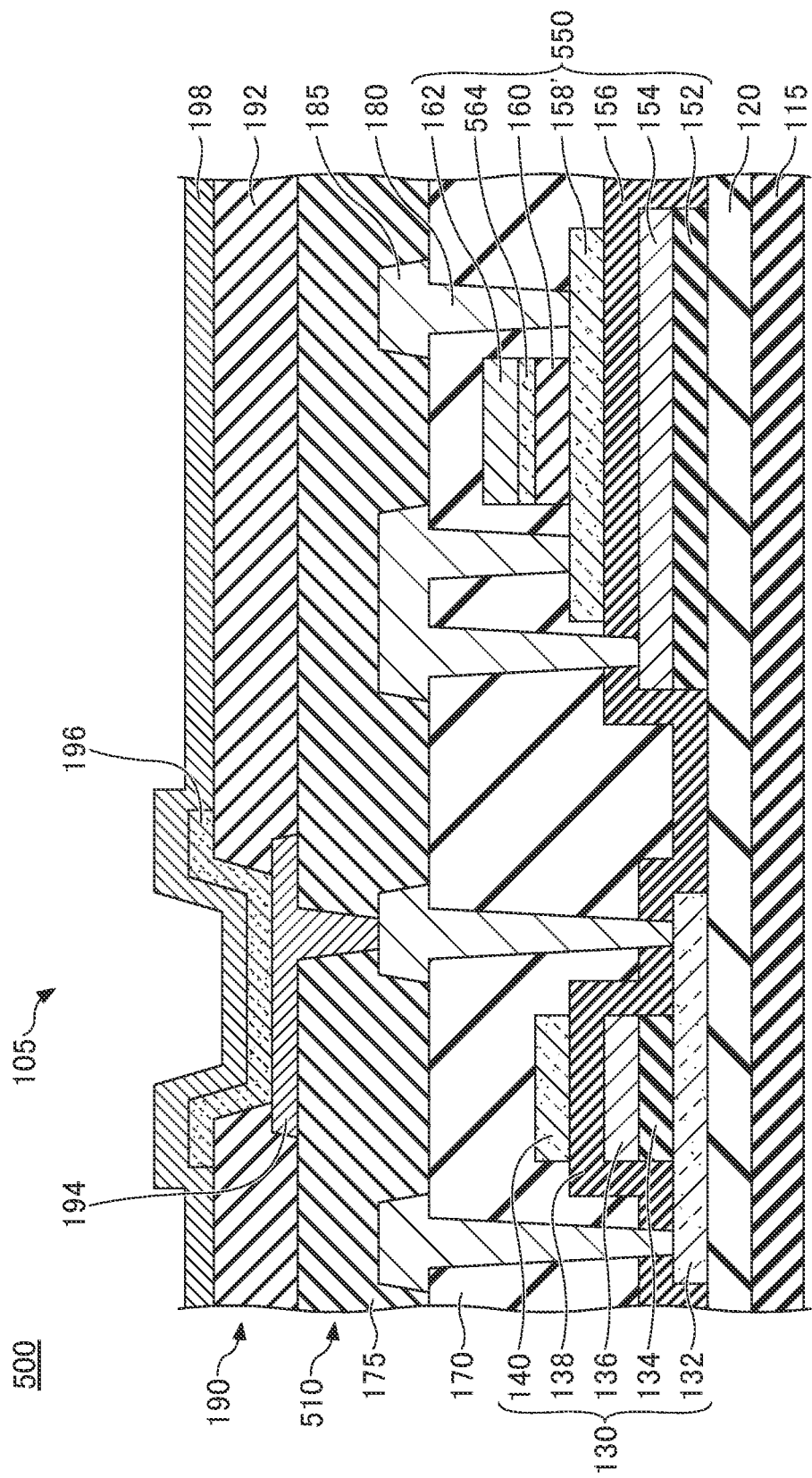
FIG. 5 is a cross-sectional view of a portion of a display panel including a semiconductor device according to a second embodiment of the present application.

Referring now to FIG. 5, a semiconductor device according to a second embodiment of the present application will be described. FIG. 5 is a schematic cross-sectional view of a portion of a display panel 500 including a semiconductor device according to the second embodiment. As can be seen by comparing FIG. 5 to FIG. 1, the display panel 500 largely includes the same or similar components as those in the display panel 100 shown in FIG. 1. Such same or similar components are indicated by same or similar reference numerals and will not be described again herein.

In the display panel 500, the second TFT structure 550 of the semiconductor structure 510 includes another oxide semiconductor layer 564 disposed between the gate insulating layer 160 and the gate electrode 162. The gate electrode of the second TFT structure 550 may be regarded as comprising the oxide semiconductor layer 564 and the gate electrode 162. The oxide semiconductor layer 564 will be also referred to as an oxide barrier layer 564 herein.

The oxide barrier layer 564 may comprise, for example, In—Ga—Zn—O, In—Sn—Ga—Zn—O, or In—Sn—Zn—O. The oxide semiconductor material used for the oxide barrier layer 564 may be the same as or different from that used for the oxide active layer 158' located below (and the capacitor upper electrode 140 of the first TFT structure 130). The oxide barrier layer 564 can be thinner than the oxide active layer 158' (which may have a thickness of about 50 nm, as described above) and may have a thickness of, for example, 10 nm to 20 nm.

Preferably, a partial pressure of oxygen in the deposition process for the oxide barrier layer 564 can be higher than that in the deposition process for the oxide active layer 158' and the capacitor upper electrode 140, such that excess oxygen can remain in the deposited oxide barrier layer 564. The excess oxygen can diffuse through the underlying gate insulating layer 160 (third insulator layer) to reach the interface between the gate insulating layer 160 and the oxide active layer 158'. This interface may be damaged during deposition of the third insulator layer and have defects, for example, oxygen vacancies. The oxygen reaching the interface can cure at least a part of such defects.

Therefore, this embodiment allows the channel region of the oxide active layer 158' to have fewer defects by inserting the oxygen-rich oxide barrier layer 564, thereby making device properties of the oxide transistor more stable.

It can be understood that the semiconductor device and the display panel 500 in accordance with the second embodiment can have the same advantages as those of the semiconductor device and the display panel 100 in accordance with the first embodiment as described above. Consequently, this semiconductor device and/or display panel can be manufactured using a smaller number of photomasks and a less complicated process, while having a combination of polysilicon transistor and oxide transistor depending on a desired application and/or capability. This can result in higher production yield, higher production throughput, higher consumption efficiency in material/energy, and hence, lower production cost.

Figure 6:
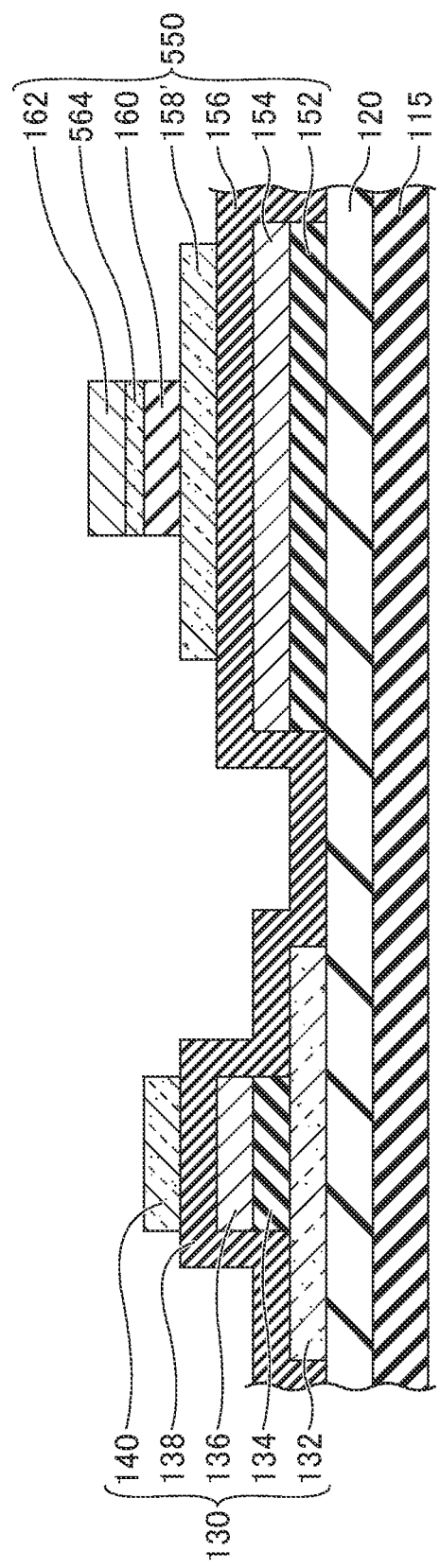
FIG. 6 is a cross-sectional view for illustrating a method of manufacturing the semiconductor device as shown in FIG. 5.

Referring now to FIG. 6, a method of manufacturing the semiconductor device according to the second embodiment of the present application will be described. This method may be the same as the method of manufacturing the semiconductor device in accordance with the first embodiment as described in detail with reference to FIGS. 4A-4I, except for the operation as described in FIG. 4D. Accordingly, FIG. 6 shows an alternative operation to the operation shown in FIG. 4D. The other operations will not be described again herein.

After the operation shown in FIG. 4C, a gate insulating layer 160 and the gate electrode 162 of the second TFT structure 550 may be formed with the oxide barrier layer 564 interposed therebetween, as shown in FIG. 6. This structure may be formed, for example, in the following way.

First, the third insulator layer (to form the gate insulating layer 160), second oxide semiconductor layer (to form the oxide barrier layer 564), and the second metal layer (to form the gate electrode 162) may be sequentially deposited over the structure in FIG. 4C. The third insulator layer may generally comprise PECVD SiOx. The second metal layer may comprise Mo deposited by sputtering. The second metal layer may comprise another metal, such as an Al alloy or W. The third insulator layer and the second metal layer may each be deposited, for example, to a thickness of about 100 nm or less. The second oxide semiconductor layer may comprise a material that is the same as or different from that used for the oxide active layer 158' located below. This oxide semiconductor layer can be thinner than the oxide active layer 158' (which may have a thickness of about 50 nm) and may have a thickness of, for example, 10 nm to 20 nm.

Next, these three layers may be patterned. The second oxide semiconductor layer can be patterned simultaneously with the second metal layer. Accordingly, the second metal layer, the second oxide semiconductor layer, and the third insulator layer can be patterned using the fourth photomask, which may be the same as the photomask in FIG. 4D, by a conventional photolithography and dry etching process. Also, plasma used during this dry etching can at least partially convert the capacitor upper electrode 140 of the first TFT structure 130 and the S/D regions in the oxide active layer 158' of the second TFT structure 550.

Preferably, as described above, a partial pressure of oxygen in the deposition process for the second oxide semiconductor layer can be higher than that in the deposition process for the oxide active layer, such that excess oxygen can remain in the second oxide semiconductor layer as deposited. In addition, the method may include applying heat treatment at any time after deposition of the second oxide semiconductor layer (e.g., after etching of the second metal layer and the second oxide semiconductor layer, or after etching of the third insulator layer). This heat treatment allows the excess oxygen in this oxygen-rich oxide semiconductor layer to diffuse through the underlying third insulator layer to reach the interface between the third insulator layer and the oxide active layer 158', thereby at least partially curing defects at the interface due to damage during deposition of the third insulator layer. Thus, providing the oxide barrier layer 564 allows the channel region of the oxide active layer 158' to have fewer defects, thereby making the device properties of the oxide transistor more stable.

After the operation shown in FIG. 6, the operations as described in connection with FIGS. 4E-4I may be performed to complete the display panel 500 shown in FIG. 5.

Figure 7:
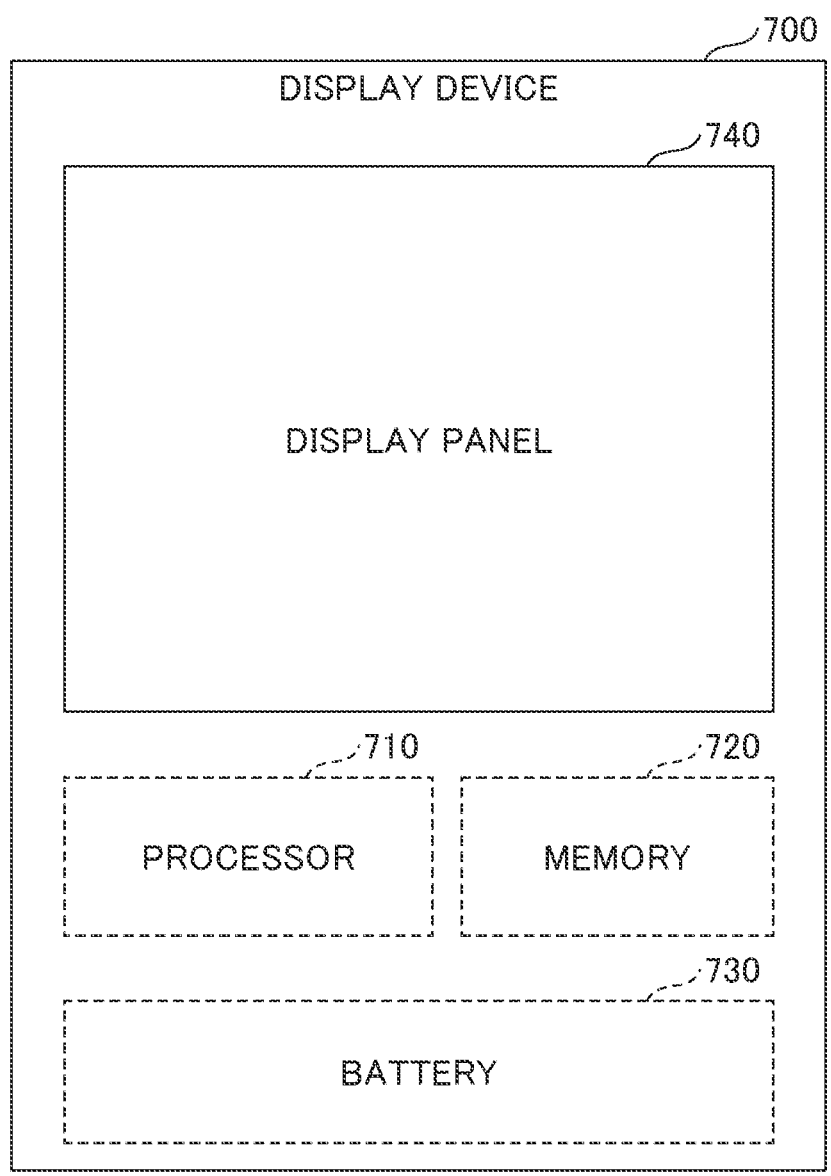
FIG. 7 is a diagram of a display device according to an embodiment of the present application.

Referring now to FIG. 7, there is shown a schematic diagram of a display device 700 in accordance with an embodiment of the present application. In some embodiments, the display device 700 may be a battery-powered mobile device, such as a smartphone, a smartwatch, a tablet computer, a laptop computer, or the like.

In other embodiments, the display device 700 may be a device that is generally connected to mains power, such as a television or a monitor, or a device that is generally connected to an external battery, such as an in-vehicle display. Additionally, the display device 700 may be any other device, such as a digital signage device, regardless of the type of power supply.

In the example illustrated in FIG. 7, the display device 700 includes a processor 710, a memory 720, a battery 730, and a display panel 740. The processor 710, memory 720, and battery 730 may be contained within a housing of the display device 700, as indicated by dashed lines in FIG. 7. The display panel 740 may be assembled with the housing in such a manner that the front surface of the display panel 740 is visible from a user of the display device 700, as shown by solid lines in FIG. 7. The processor 710, the memory 720, the battery 730, and the display panel 740 may be electrically connected to each other.

Although not shown, the display device 700 may include a radio frequency (RF) circuit, a speaker, a microphone, an input device, a sensor, a camera, an antenna, a near field communication module, and/or the like.

The processor 710 may be configured to invoke a software program and data stored in the memory 720 and execute the software program to perform various functions and/or data processing of the display device 700. The processor 710 may include any suitable special-purpose or general-purpose processing device or unit. Additionally, the processor 710 may include any suitable number of processors. For example, the processor 710 may include one or more of a microprocessor, a microcontroller, an application processor, a central processing unit (CPU), a graphics processing unit (GPU), a digital signal processor (DSP), an application-specific integrated circuit (ASIC), a Field Programmable Gate Array (FPGA), and the like.

The memory 720 may be configured to store a software program and data, and may include any suitable medium that may be accessed by the processor 710. Additionally, the memory 720 may include any suitable number of memories. The memory 720 can include volatile memory and/or non-volatile memory, and may include, for example, a random access memory (RAM), a read-only memory (ROM), and/or a flash memory. It should be noted that the term "memory" as used herein may refer to a mass storage that can store large amounts of data. Therefore, the memory 720 may also include, for example, a hard disk drive (HDD), a solid state drive (SDD), an optical disk drive, or the like.

The battery 730 may be configured to supply power to each of components of the display device 700, such as the processor 710, memory 720, and the display panel 740. The processor may run a power management program or module stored in the memory 720 to control power consumption of each component, as well as, charging and discharging of the battery 730. In addition to, or instead of, the battery 730, the display device 700 may have a power connector, adapter, or the like, which is connected to an external power supply, such as mains power.

The display panel 740 may be configured to display a variety of information and content, including information entered by a user and information provided for the user. The display panel 740 may include a user input device, such as a touch screen, on at least a part of the surface exposed from the housing.

The display panel 740 may be, for example, either the display panel 100 as shown in FIG. 1 or the display panel 500 as shown in FIG. 5. Therefore, the display panel 740 may include a backplane with a semiconductor device that includes polysilicon TFTs and oxide TFTs in combination. The combination of polysilicon TFTs and oxide TFTs may enable a desired capability of the display panel 740, such as variable frequency drive (or variable refresh rate drive), high frequency or low frequency drive, and/or low power consumption drive. The low power consumption property may be utilized to increase an apparent capacity of the battery 730 of the display device 700.

Although some preferred embodiments of the present application have been described, persons skilled in the art may make changes and modifications to these embodiments without departing from the scope of present disclosure. Therefore, the following claims are intended to be construed as to cover all changes and modifications falling within the scope of the present disclosure.

What is claimed is:

1. A semiconductor device comprising:
   a first thin film transistor (TFT) structure formed on a substrate, the first TFT structure including a first transistor and a capacitor on the first transistor; and
   a second TFT structure formed on the substrate, the second TFT structure including a bottom metal layer, a second insulating layer on the bottom metal layer, and a second transistor on the second insulating layer,
   wherein a lower electrode of the capacitor comprises the same metal material as the bottom metal layer,
   a dielectric layer of the capacitor comprises the same insulator material as the second insulating layer, and
   an upper electrode of the capacitor comprises the same oxide semiconductor material as a semiconductor active layer of the second transistor.

2. The semiconductor device according to claim 1, wherein the oxide semiconductor material comprised by the upper electrode of the capacitor and the semiconductor active layer of the second transistor is at least partially converted to a conductor.

3. The semiconductor device according to claim 1, wherein the first transistor comprises a polysilicon active layer, a gate insulating layer, and a gate electrode, and the gate electrode of the first transistor also serves as the lower electrode of the capacitor.

4. The semiconductor device according to claim 3, wherein the second TFT structure further includes a first insulating layer beneath the bottom metal layer, and
   the gate electrode and the gate insulating layer of the first transistor have sidewalls aligned with each other and the bottom metal layer and the first insulating layer of the second TFT structure have sidewalls aligned with each other.

5. The semiconductor device according to claim 1, wherein each of the dielectric layer of the capacitor and the second insulating layer of the second TFT structure is a part of a continuous layer that covers the first transistor and the bottom metal layer.

6. The semiconductor device according to claim 1, wherein each of the dielectric layer of the capacitor and the second insulating layer of the second TFT structure comprises:
   a silicon oxide layer; or
   a silicon nitride layer and a silicon oxide layer covering the silicon nitride layer.

7. The semiconductor device according to claim 1, wherein the second transistor further comprises a gate insulating layer and a gate electrode over the semiconductor active layer, and the gate electrode of the second transistor includes an oxide semiconductor layer formed on the gate insulating layer.

8. A method of manufacturing a semiconductor device, wherein the semiconductor device includes a first thin film transistor (TFT) structure formed on a substrate and includes a first transistor and a capacitor on the first transistor, and a second TFT structure formed on the substrate and includes a bottom metal layer, a second insulating layer on the bottom metal layer, and a second transistor on the second insulating layer, the method comprising:
   depositing a first metal layer, which forms a lower electrode of the capacitor and the bottom metal layer,
   depositing a second insulator layer, which forms a dielectric layer of the capacitor and the second insulating layer, and
   depositing an oxide semiconductor layer, which forms an upper electrode of the capacitor and a semiconductor active layer of the second transistor.

9. The method according to claim 8, further comprising:
   using a first photomask to pattern the first metal layer into the lower electrode of the capacitor and the bottom metal layer, and
   using a second photomask to pattern the oxide semiconductor layer into the upper electrode of the capacitor and the semiconductor active layer of the second transistor.

10. The method according to claim 9, further comprising, before depositing the first metal layer:
    forming a polysilicon active layer of the first transistor; and
    depositing a first insulator layer over the polysilicon active layer,
    wherein using the first photomask further includes patterning the first insulator layer into a gate insulating layer of the first transistor and a first insulating layer beneath the bottom metal layer, and
    the lower electrode of the capacitor also serves as a gate electrode of the first transistor.

11. The method according to claim 9, further comprising, after using the second photomask to pattern the oxide semiconductor layer:
    depositing a third insulator layer;
    depositing a second metal layer on the third insulator layer; and
    using a third photomask to pattern the second metal layer and the third insulator layer into a gate electrode and a gate insulating layer of the second transistor, respectively.

12. The method according to claim 11, wherein using the third photomask to pattern the second metal layer and the third insulator layer comprises etching the second metal layer and the third insulator layer using a plasma, and the plasma at least partially converts an oxide semiconductor material of the upper electrode of the capacitor and exposed portions of the semiconductor active layer of the second transistor to a conductor.

13. The method according to claim 12, further comprising, after using the third photomask to pattern the second metal layer and the third insulator layer:
  depositing an interlayer dielectric layer over the first TFT structure and the second TFT structure using a plasma enhanced CVD (PECVD) process,
  wherein a plasma used in depositing the interlayer dielectric layer also acts to convert the oxide semiconductor material of the upper electrode of the capacitor and the exposed portions of the semiconductor active layer of the second transistor to a conductor.

14. The method according to claim 13, further comprising, after depositing the interlayer dielectric layer:
  using a fourth photomask to simultaneously form contact holes to source/drain regions of the first transistor and contact holes to source/drain regions of the second transistor by dry etching.

15. The method according to claim 13, wherein the interlayer dielectric layer is in contact with the second insulator layer, which forms the dielectric layer of the capacitor and the second insulating layer, and
  the second insulator layer comprises:
    a silicon oxide layer; or
    a silicon nitride layer and a silicon oxide layer covering the silicon nitride layer.

16. The method according to claim 11, further comprising, after depositing the third insulator layer and before the step of depositing the second metal layer:
  depositing another oxide semiconductor layer, wherein a partial pressure of oxygen is higher than when depositing the oxide semiconductor layer.

17. The method according to claim 16, further comprising:
  using a heat treatment to cause excess oxygen contained in the another oxide semiconductor layer to reach an interface between the gate insulating layer and the semiconductor active layer of the second transistor so as to cure at least a part of defects at the interface.

18. A display panel comprising:
  a backplane including a semiconductor device comprising:
    a first thin film transistor (TFT) structure formed on a substrate, the first TFT structure including a first transistor and a capacitor on the first transistor; and
    a second TFT structure formed on the substrate, the second TFT structure including a bottom metal layer, a second insulating layer on the bottom metal layer, and a second transistor on the second insulating layer,
    wherein a lower electrode of the capacitor comprises the same metal material as the bottom metal layer,
    a dielectric layer of the capacitor comprises the same insulator material as the second insulating layer, and
    an upper electrode of the capacitor comprises the same oxide semiconductor material as a semiconductor active layer of the second transistor, and
  a front plane including a light emitting structure.

19. The display panel according to claim 18, wherein the light emitting structure comprises an organic light emitting diode (OLED) structure.

20. A display device including the display panel according to claim 18.

* * * * *